United States Patent [19]

McEwan

[11] Patent Number: 5,563,605
[45] Date of Patent: Oct. 8, 1996

[54] PRECISION DIGITAL PULSE PHASE GENERATOR

[75] Inventor: Thomas E. McEwan, Livermore, Calif.

[73] Assignee: The Regents of the University of California, Oakland, Calif.

[21] Appl. No.: 510,524

[22] Filed: Aug. 2, 1995

[51] Int. Cl.⁶ .................................................. G01S 7/28
[52] U.S. Cl. ..................................... 342/202; 342/204
[58] Field of Search .................................. 342/202, 203, 342/204

[56] References Cited

U.S. PATENT DOCUMENTS

| | | | |
|---|---|---|---|
| 4,173,017 | 10/1979 | Burlage et al. | 342/162 |
| 4,710,772 | 12/1987 | Cantwell et al. | 342/92 |
| 5,184,136 | 2/1993 | Cardiasmenos | 342/153 |
| 5,302,956 | 4/1994 | Asbury et al. | 342/70 |
| 5,499,031 | 3/1996 | Bodonyi | 342/174 |

Primary Examiner—John B. Sotomayor
Attorney, Agent, or Firm—Henry P. Sartorio; Richard B. Main

[57] ABSTRACT

A timing generator comprises a crystal oscillator connected to provide an output reference pulse. A resistor-capacitor combination is connected to provide a variable-delay output pulse from an input connected to the crystal oscillator. A phase monitor is connected to provide duty-cycle representations of the reference and variable-delay output pulse phase. An operational amplifier drives a control voltage to the resistor-capacitor combination according to currents integrated from the phase monitor and injected into summing junctions. A digital-to-analog converter injects a control current into the summing junctions according to an input digital control code. A servo equilibrium results that provides a phase delay of the variable-delay output pulse to the output reference pulse that linearly depends on the input digital control code.

13 Claims, 2 Drawing Sheets

PRECISION DIGITAL PULSE PHASE GENERATOR

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to digital pulse generation technology and more particularly to inexpensive combinations of analog and digital electronics for the precision phasing of digital pulses for use in radar systems.

2. Description of Related Art

At their very basic level, radar systems transmit out radio frequency pulses and measure the time that reflections of the transmitted signal take to be reflected back. The flight time is a measure of the distance from the radar unit to the reflecting objects. Highly directional antennas allow such transmissions and signal reflections back to be narrowly focused, so that the direction to such reflective objects can also be gauged.

The present inventor, Thomas E. McEwan, describes in his U.S. patent application Ser. No. 08/359,151, filed Dec. 19, 1994, and incorporated herein, a short range, ultra-wideband radar with a high resolution swept range gate. A transmit timing pulse is connected to cause a radar transmitter to output a pulse. A receive timing pulse is connected to gate a return sample from a differential receiver that eliminates spurious noises from its close proximity to the transmitter. The gated receiver signal indicates if a reflection was detected within a narrow time window. The time window is slewed back and forth by a sweep generator to search for the detectable reflections. The exact delay of the receive timing pulse from the transmit timing pulse that produces a detectable reflection is a measure of the distance to the reflecting object, for example, from four inches to more than twenty feet.

Conventional low-cost circuits for digital pulse generation provide radar measurements that are accurate to one percent of range. However, many applications require measurements that are accurate to 0.1 percent or better.

SUMMARY OF THE INVENTION

An object of the present invention is to provide a digital timing generator with programmable phase delays between a reference pulse and a variable pulse.

A further object of the present invention is to provide an inexpensive digital timing generator with highly accurate timing.

Another object of the present invention is to provide a digital timing generator for short-range, ultra-wideband radars with high resolution swept range gates.

Briefly, a timing generator embodiment of the present invention comprises a crystal oscillator connected to provide an output reference pulse. A resistor-capacitor combination is connected to provide a variable-delay output pulse from an input connected to the crystal oscillator. A phase monitor is connected to provide duty-cycle representations of the reference and variable-delay output pulse phase. An operational amplifier drives a control voltage to the resistor-capacitor combination according to currents integrated from the phase monitor and injected into summing junctions. A digital-to-analog converter injects a control current into the summing junctions according to an input digital control code. A servo equilibrium results that provides a phase delay of the variable-delay output pulse to the output reference pulse that linearly depends on the input digital control code.

An advantage of the present invention is that a timing generator is provided that is inexpensive and accurate.

Another advantage of the present invention is that a timing generator is provided that can control a radar range measurement system with a resolution of better than 0.1%.

A further advantage of the present invention is that a timing generator is provided that converts digital input control signals to corresponding phase delays between a reference clock and a sampling clock.

DETAILED DESCRIPTION OF THE INVENTION

Figure 1:
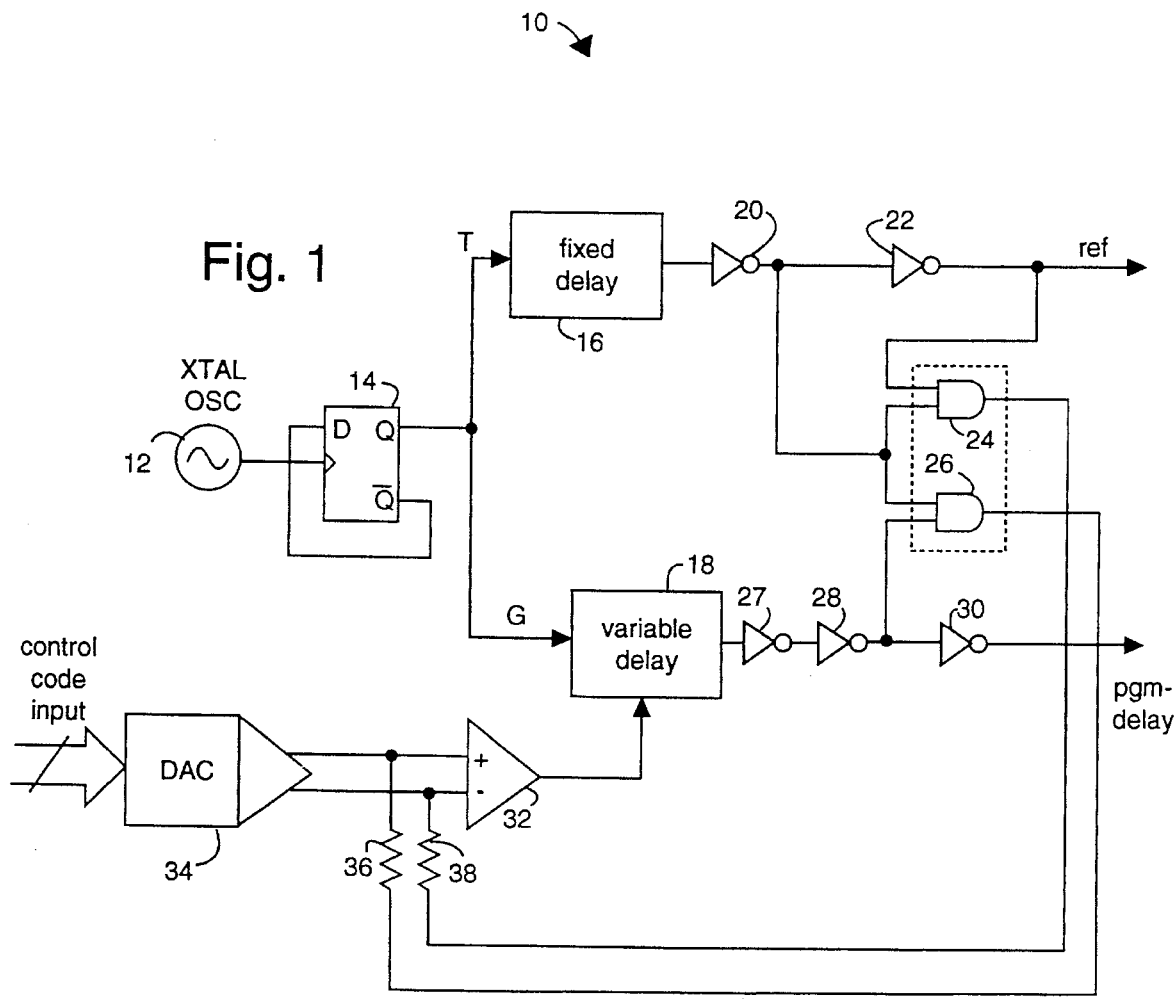
FIG. 1 is a block diagram of a timing generator embodiment of the present invention.

FIG. 1 shows a timing generator embodiment of the present invention, referred to herein by the general reference numeral 10. The timing generator 10 comprises a reference oscillator 12 connected through a flip-flop 14 to a fixed delay 16 and a voltage-controlled variable-delay 18. A pair of reference signal inverters 20 and 22 provide a first, reference signal output. A pair of AND gates 24 and 26 convert square wave signals, as output by inverter 22, into pulse width modulated signals. A set of programmable-delayed signal inverters 27, 28 and 30 provide a second signal that is variably delayed relative to the first output by inverter 22. An op-amp 32 receives differential current inputs from a digital-to-analog converter (DAC) 34 and a pair of integrating resistors 36 and 38.

In operation, the DAC 34 provides a differential output current that must be balanced by the average currents flowing through resistors 36 and 38. Such differential output current linearly tracks a digital input control code. The AND gates 24 and 26 provide pulse-width modulated signals that have a frequency fixed by the reference oscillator 12. The duty cycle of the signal provided by the AND gate 24 is constant. The duty cycle of the signal provided by the AND gate 26 is variable and depends on the variable delay 18, which in turn is controlled by the op-amp 32. A closed-loop servo is thus provided that depends on the difference of the duty cycles of the signals applied to the resistors 36 and 38. The currents that are integrated from the differences in duty cycle are forced into balance at the input of the op-amp 32 by the DAC 34. Thus, the digital input code to the DAC 34 linearly controls the skew time of the programmable-delay signal at the output of inverter 30 from the reference signal at the output of inverter 22.

The duty cycle provided by AND gate 24 represents the propagation delay of inverter 22 and is used to compensate, on an analog basis, the propagation delay of inverter 40. Propagation delays of inverters 20, 27 and 28 track each other, since the reference output and the programmable delay outputs are relative.

Figure 2:
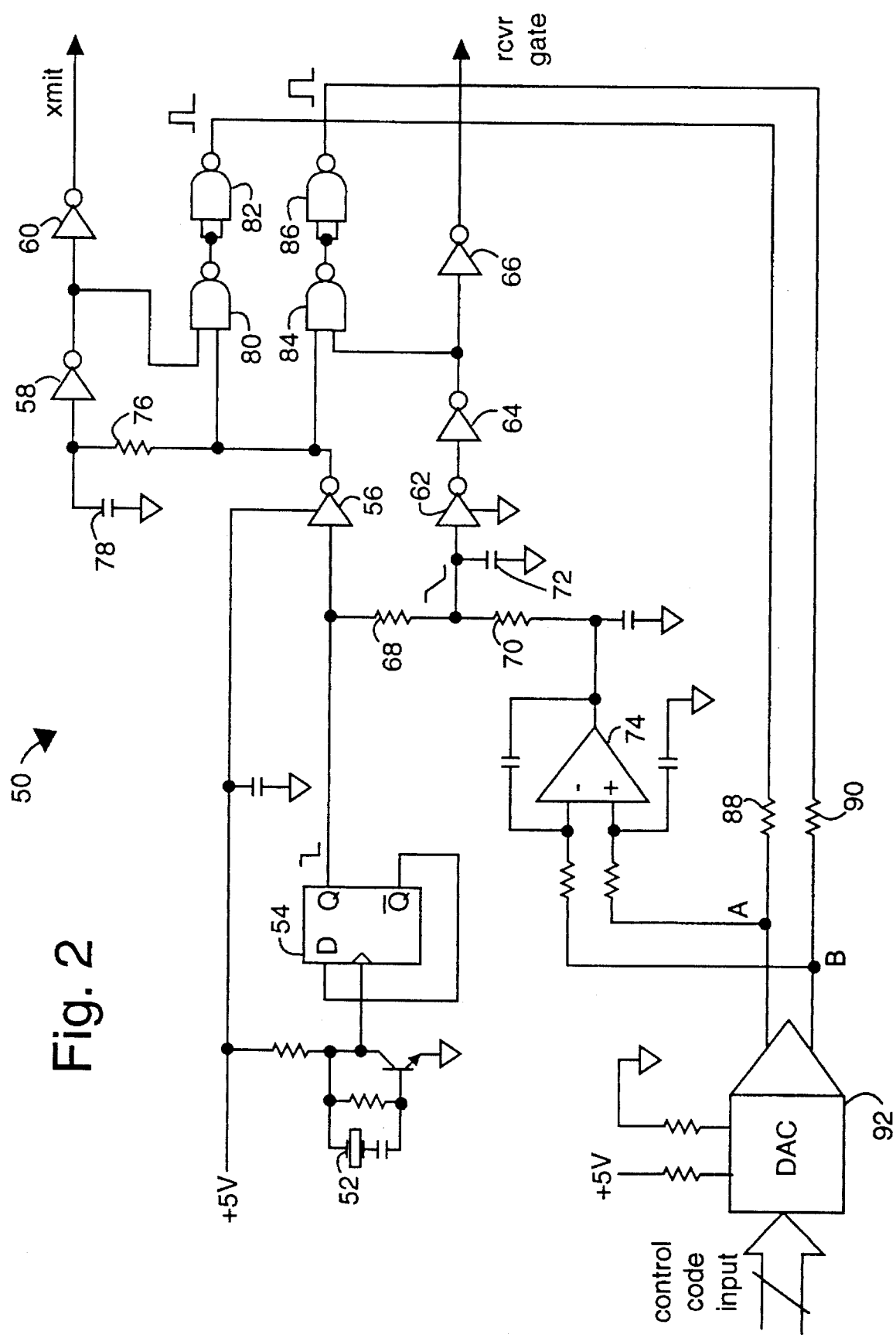
FIG. 2 is a schematic diagram of a particular implementation of the timing generator of FIG. 1.

FIG. 2 illustrates an exemplary timing generator 50, which is one of many possible particular embodiments of the present invention. The timing generator 50 provides a receiver gate pulse output that is precisely delayed from a transmitter pulse output according to a digital sweep input value. The timing generator 50 comprises a piezoelectric crystal 52 connected to provide, e.g., a 3.58 MHz clock to a flip-flop 54. The Q-output of the flip-flop 54 drives two inverter chains, one for transmit pulse development and one for receiver gate pulse development. The transmit inverter chain includes a series of inverters 56, 58 and 60. The output of inverter 60 is a square wave complement of the Q-output of the flip-flop 54, e.g., with a frequency of 1.79 MHz. The receiver gate inverter chain includes a series of inverters 62, 64 and 66. The output of inverter 66 is a delayed version of the square wave complement of the Q-output of the flip-flop 54, e.g., also with a frequency of 1.79 MHz. A resistor-capacitor combination comprising a pair of resistors 68 and 70 and a capacitor 72, e.g., 2.2K ohms each and twenty-two picofarads, delay the rising and falling edges of the Q-output of the flip-flop 54 as seen by the input of inverter 62. The voltage output of an op-amp 74 places an offset voltage across capacitor 72, and so it is able to control the delay from the Q output of flip-flop 54 to the output of inverter 62. The voltage waveform across capacitor 72 was an exponential fall with a typical time constant of about 30 ns. The offset provided by op amp 74 controls the time-to-threshold of inverter 62 and thus the delay. Another resistor-capacitor combination comprising a resistor 76 and a capacitor 78 provide a fixed delay to the input of inverter 58, e.g., six nanoseconds. The typical propagation delays input-to-output of the inverters 56, 58, 60, 62, 64 and 66 averages about three nanoseconds for typical commercially marketed devices. So the positive going edge output by the inverter 60 will be delayed from the fall of the Q-output of the flip-flop 54, e.g., by fifteen nanoseconds. Similarly, the positive going edge output by the inverter 66 will be variably delayed from the fall of the Q-output of the flip-flop 54, e.g., by fifteen to thirty-five nanoseconds.

In order to control the variable delay of the output of inverter 66, representations of the square wave transmit pulse and receiver gate pulse outputs are converted to pulse-width modulated signals by a set of NAND gates 80, 82, 84, and 86. A base reference pulse-width modulated signal is provided by NAND gates 80 and 82, e.g., a fifteen nanosecond wide pulse with a 1.79 MHz pulse repetition frequency (PRF). A feedback control pulse-width modulated signal is provided by NAND gates 84 and 86, e.g., a fifteen to thirty-five nanosecond wide pulse with a 1.79 MHz PRF. A pair of resistors 88 and 90 respectively provide for the integration of the base reference pulse-width modulated signal and the feedback control pulse-width modulated signal. Each integration will inject a current that is proportional to the duty cycle of the respective signal and the pulse height, and inversely proportional to the integration resistance. For resistor values of 10K ohms and pulse heights of five volts, a difference of as little as zero and as much as fifty microamperes of current can exist at summing junctions A and B, for a 10% duty cycle.

A digital-to-analog converter (DAC) 92 is used to sink such current differences. Given a near zero difference between summing junctions A and B, the op-amp 74 will drive the voltage input to resistor 70 in the direction and magnitude necessary to cause the duty-cycle of the feedback control pulse-width modulated signal to change enough so that the difference in currents is zero and thus achieves a closed-loop servo equilibrium. Therefore, the exact time that the output of inverter 66 is delayed, compared to the output of inverter 60, depends on the current sinking provided by the DAC 92, in spite of the exponential voltage-time relationship appearing across capacitor 72. Such current sinking can be linearly controlled by the digital sweep code input to the DAC 92. For a ten-bit DAC, the sweep of delays from fifteen to thirty-five nanoseconds can be controlled with a resolution of better than 0.1%.

In a radar application, a ten-bit DAC 92 can be connected to a ten-bit counter that runs through binary values 0000000000 to 1111111111. At each tick of the counter, a radar pulse is transmitted according to the timing of inverter 60, and a return signal is sampled at a time controlled by the inverter 66. Samples will therefore be obtained for each of the $2^{10}$ binary values from 0000000000 to 1111111111. Such digital control code indicates a measurement of the range to an object that reflects signals from the radar transmitter that are received by the radar receiver, as limited by the sample timing reference. Given that a calibration procedure provided that a binary code 0000000000 represented a range of four inches, and a code 1111111111 represented a range of twenty feet, the range to a target that provided return signals in particular sample periods can be easily determined by conventional methods. As a rule of thumb, the radar signals travel about one foot each nanosecond. So for a full range of ten feet, the time-of-flight will be twenty nanoseconds. To resolve this to 0.1% requires resolving the time of flight to twenty picoseconds.

Although particular embodiments of the present invention have been described and illustrated, such is not intended to limit the invention. Modifications and changes will no doubt become apparent to those skilled in the art, and it is intended that the invention only be limited by the scope of the appended claims.

The invention claimed is:

1. A timing generator, comprising:

reference signal means for generating a first digital signal;

delayed signal means connected to the reference signal means for generating a second digital signal having a controlled variable delay from said first digital signal according to an analog control signal;

conversion means connected to the reference signal means and the delayed signal means for transforming said first and second digital signals into a pulse-width modulated signal having a common fixed frequency and wherein said pulse-width modulated signal has a variable duty cycle proportional to a difference in timing of said second digital signal to said first digital signal;

integration means connected to the conversion means for respectively integrating said pulse-width modulated signal into a first analog signal having a magnitude proportional to said duty cycle;

servo control means connected to receive said integrated analog signals from the integration means and connected to provide said analog control signal to the delayed signal means that is proportional to a difference between said magnitudes of said respective analog signal; and a digital-to-analog converter (DAC) connected to receive a digital control code and having an analog output connected to the servo control means that provides for a second analog signal summed with said first analog signal according to said digital control code;

wherein said digital control code provides for a linear control of the delay of said second digital signal compared to said first digital signal.

2. The timing generator of claim 1, wherein:

the reference signal means comprises a crystal oscillator connected to a flip-flop that provides for a square-wave output.

3. The timing generator of claim 1, wherein:

the delayed signal means comprises a resistor-capacitor combination with a pair of resistors wherein one resistor is connected to the reference signal means and another resistor is connected to said analog control signal.

4. The timing generator of claim 1, wherein:

the conversion means comprises logic gates connected to the reference signal means and the delayed signal means that provide said first pulse-width modulated signal and said second pulse-width modulated signal.

5. The timing generator of claim 1, wherein:

the integration means comprises resistors that are independently connected to the conversion means and convert constant-amplitude voltage pulses from the conversion means into current signals that vary according to the duty cycles of said constant-amplitude voltage pulses.

6. The timing generator of claim 1, wherein:

the servo control means comprises an op-amp with a pair of summing junctions connected to receive said integrated analog signals in the form of currents from the integration means and connected to provide said analog control signal as a voltage to the delayed signal means.

7. The timing generator of claim 1, wherein:

said first digital signal provides a timing reference for a radar transmitter and said second digital signal provides a sample timing reference for a radar receiver associated with said radar transmitter.

8. The timing generator of claim 7, wherein:

said digital control code indicates a measurement of the range to an object that reflects signals from said radar transmitter that are received by said radar receiver as limited by said sample timing reference.

9. A timing generator, comprising:

a crystal oscillator connected to a flip-flop and providing for a square-wave reference clock;

a first series connected chain of inverters connected to said square-wave reference clock and providing for a timing reference output signal;

a resistor-capacitor combination having a first resistor connected to said square-wave reference clock, a second resistor connected to receive a voltage control signal, and a capacitor connected across an output;

a second series connected chain of inverters connected to said output of the resistor-capacitor combination and providing for a variable delay output signal;

a first logic gate having a pair of inputs connected between a part of the second series connected chain of inverters and said flip-flop and providing for a variable duty-cycle pulse signal having a constant frequency fixed by the crystal oscillator;

an op-amp having a first summing junction connected through a first integration resistor to the first logic gate and an output connected to provide said voltage control signal to the resistor-capacitor combination according to a difference in currents injected into said first summing junction; and a digital-to-analog converter (DAC) connected to inject a setpoint current into said first summing junction in linear relationship to a digital control code input signal;

wherein said digital control code provides for a linear control of the delay of said variable delay output signal compared to said square-wave reference clock.

10. The timing generator of claim 9, wherein:

the op-amp comprises a differential-input-single-ended-output op-amp further including a second summing junction;

a second logic gate with a pair of inputs is connected across a part of the first series-connected chain of inverters and provides for a fixed duty-cycle pulse signal having a constant frequency fixed by the crystal oscillator to said second summing junction; and the DAC is connected to inject another setpoint current into said second summing junction in linear relationship to said digital control code input signal.

11. A method for digitally controlling the phase delay between a reference clock and a sample clock, the method comprising the steps of:

generating a reference frequency;

generating a sampling frequency having the same frequency of said reference frequency but separated in phase;

generating a fixed-frequency variable-duty-cycle pulse signal from said sampling frequency with a duty cycle that varies linearly with said phase difference between said sampling frequency and said reference frequency;

integrating said variable-duty-cycle pulse signal to yield a first current proportional to the duty cycle of said variable-duty-cycle pulse signal;

converting a digital control code into a control current connected to add to or subtract from said first current; and producing a control voltage connected to affect said phase difference between said sampling frequency and said reference frequency;

wherein said digital control code provides for a linear control of the phase difference between said sampling frequency and said reference frequency.

12. The method of claim 11, further comprising the steps of:

generating a fixed-frequency fixed duty cycle pulse signal from said reference frequency;

integrating said fixed duty cycle pulse signal to yield a second current proportional to the duty cycle of said fixed duty cycle pulse signal;

differencing said first and second currents to produce said control voltage connected to affect said phase difference between said sampling frequency and said reference frequency; and converting said digital control code into said control current connected to add to or subtract from said first and second currents.

13. The method of claim 11, further comprising the steps of:

controlling a radar transmitter with said reference frequency; and sampling a radar return signal with a radar receiver connected to said sampling frequency;

wherein the range to a reflective object providing said return radar signal is a measure indicated by said digital control code.

* * * * *